(12) United States Patent
Fallourd et al.

(10) Patent No.: US 12,230,602 B2
(45) Date of Patent: Feb. 18, 2025

(54) METHOD FOR MANUFACTURING ELECTRONIC CHIPS

(71) Applicant: STMICROELECTRONICS (TOURS) SAS, Tours (FR)

(72) Inventors: Ludovic Fallourd, Louans (FR); Christophe Serre, Saint Cyr sur Loire (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 62 days.

(21) Appl. No.: 17/811,560

(22) Filed: Jul. 8, 2022

(65) Prior Publication Data

US 2022/0344303 A1 Oct. 27, 2022

Related U.S. Application Data

(63) Continuation of application No. 17/111,198, filed on Dec. 3, 2020, now Pat. No. 11,393,786.

(30) Foreign Application Priority Data

Dec. 4, 2019 (FR) ........................................ 1913750

(51) Int. Cl.
*H01L 23/00* (2006.01)
*H01L 21/78* (2006.01)

(52) U.S. Cl.
CPC .............. *H01L 24/94* (2013.01); *H01L 21/78* (2013.01); *H01L 24/11* (2013.01); *H01L 24/13* (2013.01); *H01L 2224/1132* (2013.01); *H01L 2224/13017* (2013.01); *H01L 2224/13026* (2013.01); *H01L 2224/13111* (2013.01); *H01L 2224/13139* (2013.01)

(58) Field of Classification Search
CPC ......... H01L 24/94; H01L 21/78; H01L 24/11; H01L 24/13; H01L 2224/1132; H01L 2224/13017; H01L 2224/13026; H01L 2224/13111
See application file for complete search history.

(56) References Cited

U.S. PATENT DOCUMENTS

| | | |
|---|---|---|
| 4,640,721 A | 2/1987 | Uehara et al. |
| 5,428,248 A | 6/1995 | Cha |
| 5,606,198 A | 2/1997 | Ono et al. |
| 5,770,888 A | 6/1998 | Song et al. |

(Continued)

FOREIGN PATENT DOCUMENTS

| | | |
|---|---|---|
| CN | 1812075 A | 8/2006 |
| CN | 104022043 A | 9/2014 |

(Continued)

*Primary Examiner* — Mohammad M Choudhry
(74) *Attorney, Agent, or Firm* — Seed IP Law Group LLP

(57) ABSTRACT

A method for manufacturing electronic chips includes depositing, on a side of an upper face of a semiconductor substrate, in and on which a plurality of integrated circuits has been formed, a protective resin. The method includes forming, in the protective resin, at least one cavity per integrated circuit, in contact with an upper face of the integrated circuit. Metal connection pillars are formed by filling the cavities with metal. The integrated circuits are separated into individual chips by cutting the protective resin along cut lines extending between the metal connection pillars.

20 Claims, 12 Drawing Sheets

(56) References Cited

U.S. PATENT DOCUMENTS

| | | |
|---|---|---|
| 5,910,687 A | 6/1999 | Chen et al. |
| 5,998,877 A | 12/1999 | Ohuchi |
| 6,326,689 B1 | 12/2001 | Thomas |
| 6,498,099 B1 | 12/2002 | McLellan et al. |
| 7,935,568 B2 | 5/2011 | Oganesian et al. |
| 8,278,213 B2 | 10/2012 | Kameyama et al. |
| 8,551,815 B2 | 10/2013 | Avsian et al. |
| 11,393,785 B2 | 7/2022 | Fallourd et al. |
| 2003/0067001 A1 | 4/2003 | Poo et al. |
| 2005/0095750 A1 | 5/2005 | Lo et al. |
| 2006/0012967 A1 | 1/2006 | Asai et al. |
| 2006/0170112 A1* | 8/2006 | Tanaka .................. H01L 24/05 257/777 |
| 2007/0026567 A1 | 2/2007 | Beer et al. |
| 2007/0096295 A1 | 5/2007 | Burtzlaff et al. |
| 2009/0243097 A1 | 10/2009 | Koroku et al. |
| 2010/0246152 A1 | 9/2010 | Lin et al. |
| 2011/0018116 A1 | 1/2011 | Feng |
| 2011/0042799 A1 | 2/2011 | Kang et al. |
| 2011/0189822 A1 | 8/2011 | Sasaki et al. |
| 2011/0274299 A1* | 11/2011 | Shaw .................. B81B 7/0064 381/174 |
| 2011/0304008 A1 | 12/2011 | Yang |
| 2012/0034760 A1 | 2/2012 | Schuderer et al. |
| 2012/0178251 A1 | 7/2012 | Lim et al. |
| 2012/0282735 A1 | 11/2012 | Ahn et al. |
| 2013/0161813 A1* | 6/2013 | Miki ................ H01L 21/76898 257/737 |
| 2013/0267124 A1 | 10/2013 | Chang et al. |
| 2014/0054796 A1 | 2/2014 | Gong et al. |
| 2015/0228557 A1 | 8/2015 | Cheng et al. |
| 2015/0255349 A1 | 9/2015 | Holden et al. |
| 2017/0025356 A1 | 1/2017 | Xue |
| 2017/0077022 A1 | 3/2017 | Scanlan et al. |
| 2017/0084686 A1 | 3/2017 | Wang et al. |
| 2017/0222019 A1 | 8/2017 | Wang et al. |
| 2017/0316957 A1 | 11/2017 | Chen et al. |
| 2017/0323840 A1 | 11/2017 | Chiu et al. |
| 2018/0005912 A1 | 1/2018 | Oh et al. |
| 2018/0008920 A1 | 1/2018 | Peterson, II et al. |
| 2018/0033781 A1 | 2/2018 | Zhou et al. |
| 2018/0068920 A1 | 3/2018 | Leung et al. |
| 2018/0204780 A1 | 7/2018 | Chiu et al. |
| 2018/0330966 A1 | 11/2018 | Scanlan et al. |
| 2019/0244853 A1 | 8/2019 | Berger et al. |
| 2020/0126877 A1 | 4/2020 | Takaoka |
| 2022/0375840 A1 | 11/2022 | Ory et al. |
| 2023/0178380 A1 | 6/2023 | De Cruz et al. |

FOREIGN PATENT DOCUMENTS

| | | |
|---|---|---|
| CN | 105374762 A | 3/2016 |
| CN | 107808871 A | 3/2018 |
| CN | 108807197 A | 11/2018 |
| EP | 1085570 A2 | 3/2001 |
| EP | 3154085 A1 | 4/2017 |
| EP | 3211670 A1 | 8/2017 |
| EP | 3282476 A1 | 2/2018 |
| KR | 100595885 B1 * | 6/2000 |
| KR | 20030008646 A | 1/2003 |
| WO | WO 2020250660 A1 | 12/2020 |

* cited by examiner

METHOD FOR MANUFACTURING ELECTRONIC CHIPS

BACKGROUND

Technical Field

The present disclosure relates to a method for manufacturing electronic chips. It is more specifically directed to method for so-called surface-mount chips, i.e., comprising, on the side of at least one face, one or more connection metallizations intended to be soldered to connection areas of an external device, for example a printed circuit board or another chip.

Description of the Related Art

For certain applications, there is a need for surface-mount chips in which the connection metallizations intended to be soldered to an external device extend up to the flanks of the chips. These are referred to as chips with wettable flanks. During soldering, a part of the soldering material thus rises onto the flanks of the chips, by which means it is possible to implement a visual inspection of the quality of the connections. This need exists, for example, in sensitive fields such as the automotive field or the medical field.

It would desirable to improve at least partly certain aspects of the known methods for manufacturing electronic chips with wettable flanks.

BRIEF SUMMARY

It would desirable to improve at least partly certain aspects of the known methods for manufacturing electronic chips with wettable flanks.

According to a first aspect, an embodiment provides a method for manufacturing electronic chips, comprising the following steps:
a) forming, on the side of the upper face of a semiconductor substrate, in and on which a plurality of integrated circuits has been formed beforehand, trenches laterally separating the integrated circuits;
b) depositing, on the side of the upper face of the substrate at least one metal connection pillar per integrated circuit, in contact with the upper face of the integrated circuit, and a protective resin, extending in the trenches and on the upper face of the integrated circuits;
c) forming, from the upper face of the protective resin, openings located across from the trenches and extending over a width greater than or equal to that of the trenches, so as to clear a flank of at least one metal pillar of each integrated circuit;
d) thinning the substrate via its lower face until the protective resin at the bottom of the trenches is reached; and
e) cutting the protective resin across from the trenches, so as to separate the integrated circuits into individual chips.

According to an embodiment, step b) precedes step a).
According to an embodiment, step a) precedes step b).
According to an embodiment, step b) comprises the following steps:
b1) depositing the protective resin on the side of the upper face of the substrate and forming cavities in the protective resin, the cavities having the same shape and the same arrangement as the metal connection pillars; and b2) filling the cavities with metal in order to form the metal connection pillars.

According to an embodiment, step b1) comprises the following successive steps:
depositing a film of sacrificial resin on the side of the upper face of the substrate;
etching the film of resin in order to retain only pillars of sacrificial resin having the same shape and the same arrangement as the metal connection pillars;
depositing the protective resin on the side of the upper face of the substrate; and
selectively removing the pillars of sacrificial resin with respect to the protective resin, so as to form in the protective resin the cavities having the same shape and the same arrangement as the metal connection pillars.

According to an embodiment, step b1) comprises the following successive steps:
depositing the protective resin on the side of the upper face of the substrate; and
forming the cavities in the protective resin by laser drilling.

According to an embodiment, the filling of the cavities with metal in step b2) is realized by a non-electrolytic deposition method.

According to an embodiment, when viewed from above, at least one metal connection pillar formed in step b) is flush with an edge of a trench.

According to an embodiment, each opening formed in step c) is a trench extending over the entire length of the underlying trench formed in step a).

According to an embodiment, the openings are realized by sawing.

According to an embodiment, the openings formed in step c) are localized across from only a part of the length of the trenches formed in step a).

According to an embodiment, the openings are realized by laser ablation.

According to an embodiment, the metal connection pillars are formed from a tin-based alloy.

According to an embodiment, the method provides between step d) and step e), a step of depositing a rear-face protective resin on the lower face of the substrate.

According to a second aspect, an embodiment provides a method for manufacturing electronic chips, comprising the following steps:
I) depositing, on the side of the upper face of a semiconductor substrate, in and on which a plurality of integrated circuits has been formed beforehand, a protective resin, and forming, in the protective resin, at least one cavity per integrated circuit, in contact with the upper face of the integrated circuit; and
II) filling the cavities with metal in order to form metal connection pillars.

According to an embodiment, step I) comprises the following successive steps:
a) forming, on the side of the upper face of the semiconductor substrate, at least one pillar of sacrificial resin per integrated circuit, in contact with the upper face of the integrated circuit;
b) depositing, on the side of the upper face of the substrate, the protective resin, extending between the pillars of sacrificial resin; and
c) selectively removing the pillars of sacrificial resin with respect to the protective resin, so as to form the cavities in the protective resin.

According to an embodiment, step I) comprises the following successive steps:

depositing the protective resin on the side of the upper face of the substrate; and forming the cavities in the protective resin by laser drilling.

According to an embodiment, the filling of the cavities with metal in step II) is realized by a non-electrolytic deposition method.

According to an embodiment, the metal used in step II) for filling the cavities is a tin-based alloy.

According to an embodiment, step a) comprises a step of depositing a film of sacrificial resin on the side of the upper face of the substrate, followed by a step of etching the film in order to retain only the pillars of sacrificial resin.

According to an embodiment, the film of sacrificial resin deposited in step a) is made of a photosensitive resin.

According to an embodiment, in step a), the film of sacrificial resin is etched by photolithography in order to form pillars of sacrificial resin.

According to an embodiment, the method provides comprising, before step I), a step of forming, on the side of the upper face of the semiconductor substrate, trenches laterally separating the integrated circuits.

According to an embodiment, the protective resin deposited in step I) extends in the trenches.

According to an embodiment, the method provides a step of thinning the substrate via its lower face until the protective resin at the bottom of the trenches is reached, followed by a step of cutting the protective resin across from the trenches, so as to separate the integrated circuits into individual chips.

According to an embodiment, the method provides, between the thinning step and the cutting step, a step of depositing a rear-face protective resin on the lower face of the substrate.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the realization of the integrated circuits present in the described electronic chips has not been described in detail.

Unless indicated otherwise, when reference is made to two elements that are connected together, this means a direct connection without any intermediate elements other than conductors, and when reference is made to two elements that are coupled together, this means that these two elements can be connected or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 to 10 depict, in a schematic and partial fashion, successive steps of an example of a method for manufacturing electronic chips according to a first embodiment.

Figure 1:
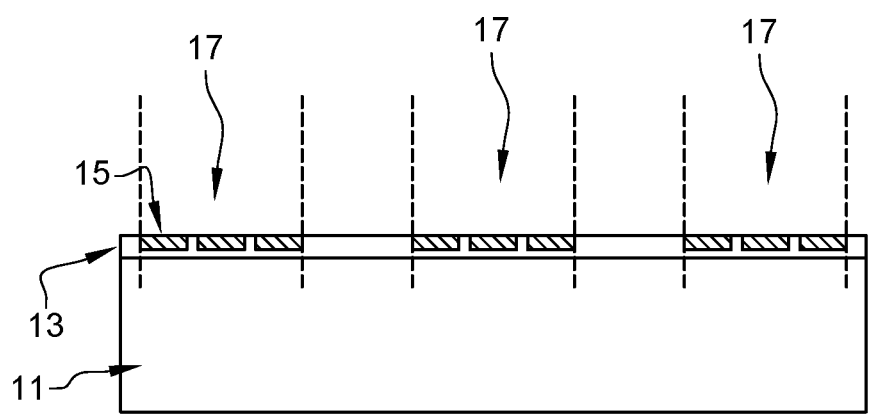
FIG. 1 depicts a step of a method for manufacturing electronic chips according to a first embodiment.

FIG. 1 is a sectional view of an initial structure comprising a semiconductor substrate 11 in and on which integrated circuits 17 have been formed beforehand. The circuits 17 are, for example, all identical with the exception of the manufacturing dispersions. The substrate 11 can correspond to a wafer of a semiconductor material, for example silicon.

The substrate 11 has, for example, a thickness comprised between 300 and 900 µm, for example a thickness of approximately 725 µm.

The structure shown in FIG. 1 further comprises a stack of conductive and isolating layers 13 covering the upper face of the substrate 11, called interconnection stack, in which elements for interconnecting the components of each circuit 17 can be formed. The interconnection stack 13 comprises in particular, for each integrated circuit 17, one or more metal contact pads 15 flush with the upper face of the integrated circuit 17 and intended to be connected to an external device. In FIG. 1, three metal contact pads 15 have been illustrated, for each integrated circuit 17, it being understood that, in practice, the number of metal contact pads 15, for each integrated circuit 17, can be different to three.

Each integrated circuit comprises, for example, one or more electronic components (transistors, diodes, thyristors, triacs, etc.).

In FIG. 1, three integrated circuits 17 have been illustrated, it being understood that, in practice, the number of integrated circuits 17 formed in and on the substrate 11 can be different to three.

Figure 2:
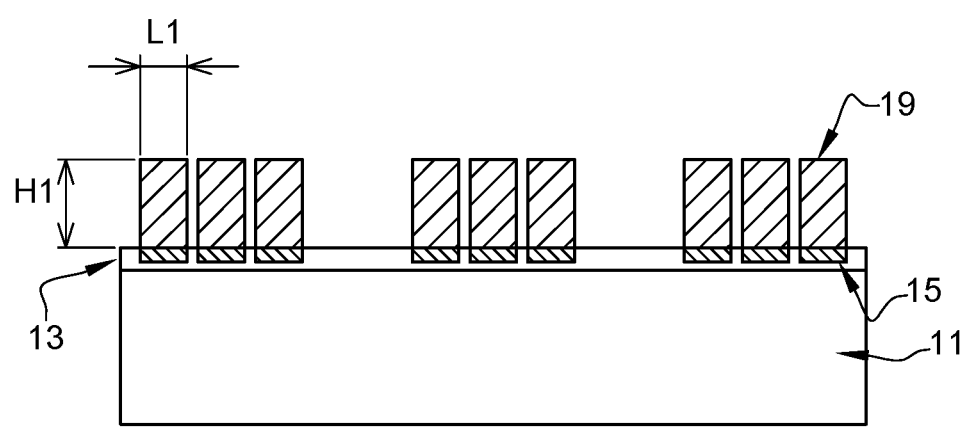
FIG. 2 depicts a further step of a method for manufacturing electronic chips according to the first embodiment.

FIG. 2 is a sectional view depicting a step of forming metal connection pillars 19 on and in contact with the metal pads 15.

More specifically, in this example, a connection pillar 19 is formed on each pad 15. Each pillar 19 extends, for example, when viewed from above, over the entire surface of the underlying pad 15. Each pillar 19 has, for example, when viewed from above, a square or rectangular shape. As an alternative, the pillars can have other shapes, for example a circular shape or irregular shape. For instance, each pillar has a width L1, (or diameter in the case of pillars circular in shape) greater than 50 µm. The metal pillars 19 extend vertically above the pads 15 over a height H1. The height H1 of the pillars 19 is, for example, comprised between approximately 80 and 150 µm. The upper face of the pillars 19 is, for example, substantially flat. The pillars 19 can, for example, be formed by electrolytic growth. The pillars 19 can be made of a tin-based alloy, for example an alloy based on tin and silver (SnAg). One or more metal interface layers, not illustrated, may be provided between the pads 15 and the pillars 19, the interface layers forming, for example, a stack of the type UBM (Under Bump Metallization).

Figure 3:
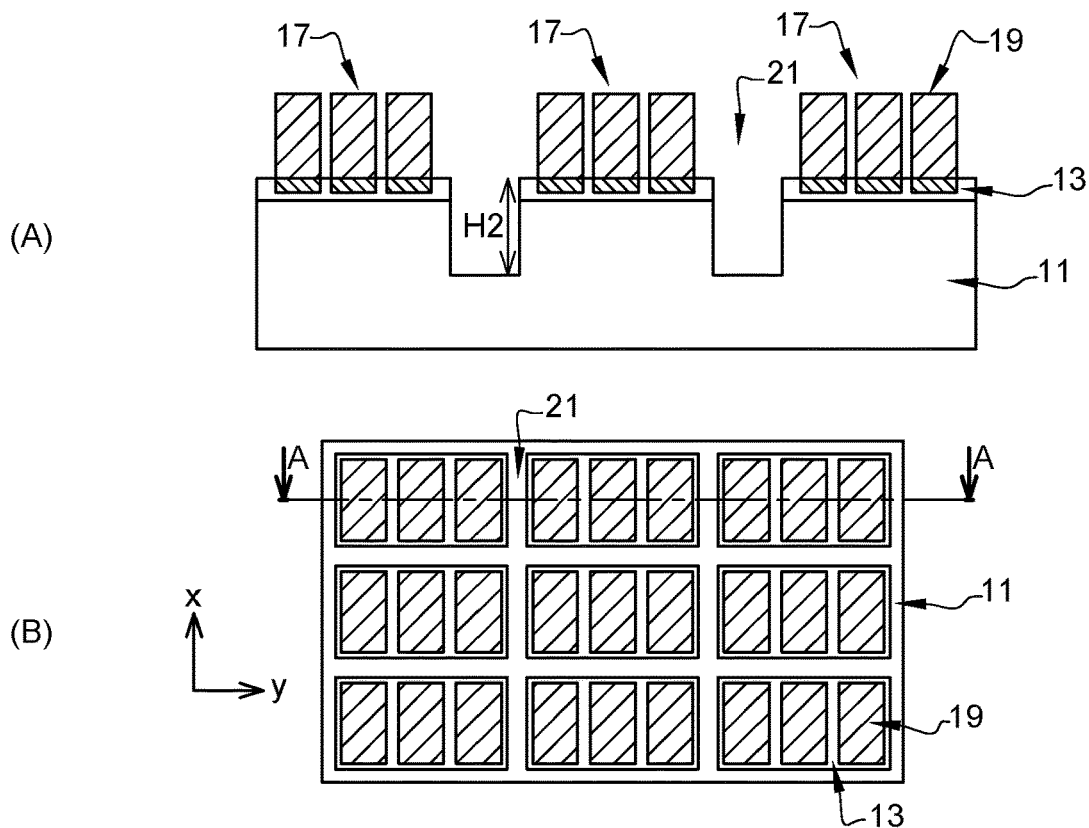
FIG. 3 depicts a further step of a method for manufacturing electronic chips according to the first embodiment.

FIG. 3 depicts a step of forming trenches 21 in the upper face of the structure obtained at the end of the steps shown in FIGS. 1 and 2. More specifically, FIG. 3 comprises a sectional view (A) and a top view (B) of the structure after the formation of the trenches 21. The view (A) corresponds to a sectional view, according to the sectional plane A-A indicated in the view (B).

The trenches 21 extend between the circuits 17 so that, when viewed from above, each circuit 17 is separated from its neighbor(s) by trenches 21. For instance, each circuit 17 is entirely delimited, laterally, by trenches 21. The trenches 21 can, for example, when viewed from above, form a continuous grid extending between the integrated circuits 17.

In this example, each trench 21 extends vertically, from the upper face of the stack 13, and continues into the substrate 11, over a depth greater than the depth of the integrated circuits 17. In this example, the trenches 21 are non-through, i.e., they do not exit on the lower side of the substrate 11. The trenches 21 extend vertically over a depth H2, for example comprised between 100 µm and 400 µm, for example in the order of 250 µm. The trenches 21 are, for example, realized by sawing or by another way of cutting, for example, by laser etching. During the sawing step, the structure can be mounted on a support film, not illustrated, disposed on the side of the lower face of the substrate 11, the film then being removed after the formation of the trenches 21.

Figure 4:
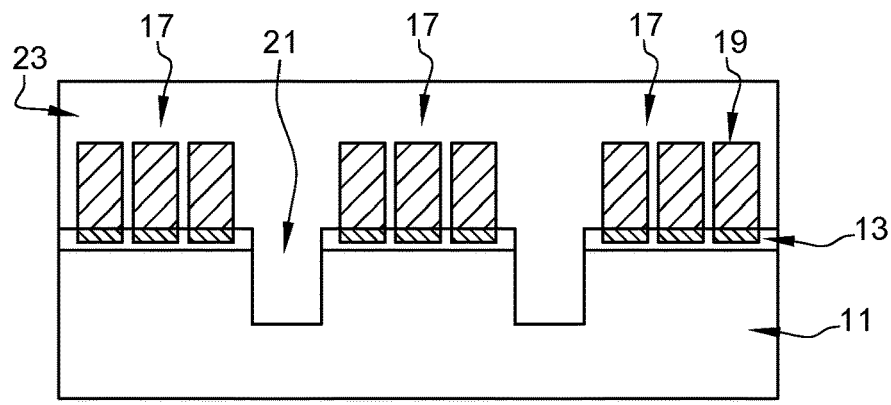
FIG. 4 depicts a further step of a method for manufacturing electronic chips according to the first embodiment.

FIG. 4 is a sectional view depicting a step of depositing a protective resin layer 23 on the upper face of the structure obtained at the end of the steps shown in FIGS. 1 to 3. More specifically, the upper face of the structure is completely covered and in particular the pillars 19 and the stack 13 are covered and the trenches 17 are filled by a protective resin 23. The resin 23 is, for example, an epoxy resin.

Figure 5:
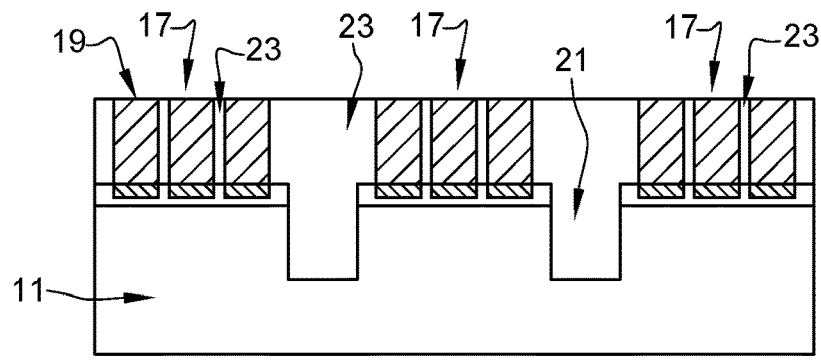
FIG. 5 depicts a further step of a method for manufacturing electronic chips according to the first embodiment.

FIG. 5 is a sectional view depicting a step of planarizing the upper face of the structure obtained at the end of the steps shown in FIGS. 1 to 4, for example by CMP (Chemical Mechanical Polishing). During this step, an upper part of the protective resin 23 is removed, so as to clear the access to the upper face of the pillars 19. Thus, the pillars 19 are flush with the upper face of the layer of resin 23.

Figure 6:
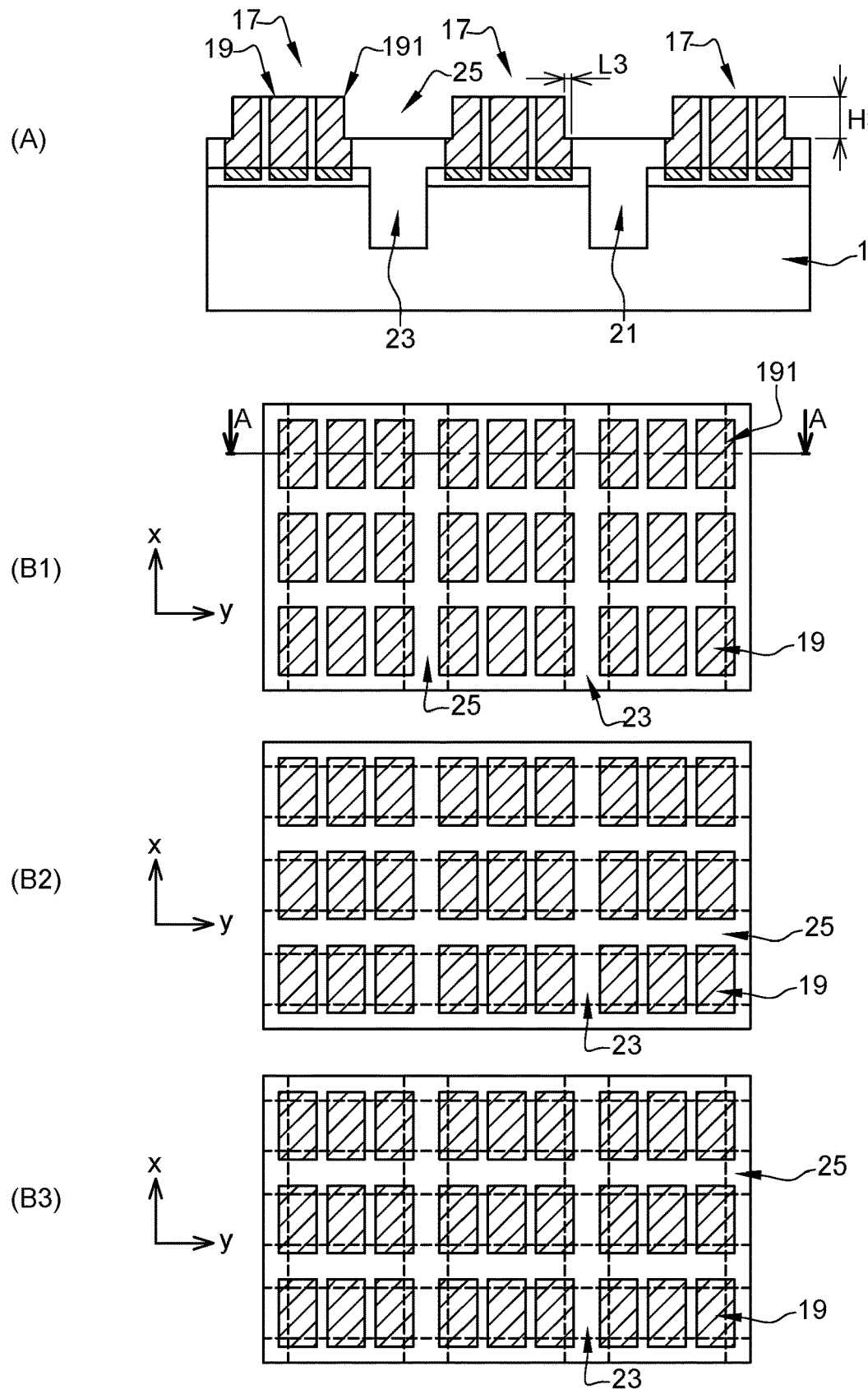
FIG. 6 depicts a further step of a method for manufacturing electronic chips according to the first embodiment.

FIG. 6 depicts a step of forming, on the side of the upper face of the structure obtained at the end of the steps shown in FIGS. 1 to 5, openings 25 extending vertically, from the upper face of the structure, over a depth H3 less than or equal to the height of the metal pillars 19. The depth H3 is, for example, in the order of 100 µm.

FIG. 6 comprises a sectional view (A) and three top views (B1), (B2), and (B3) of the structure after the formation of the openings 25. The view (A) corresponds to a sectional view, according to the sectional plane A-A indicated in the view (B1). The views (B2) and (B3) illustrate two alternative implementations of the step shown in FIG. 6.

Each opening 25 is realized across from a trench 21 and has, in this example, a width greater than or equal to the underlying trench 21. More specifically, in this example, the width of each opening 25 is chosen so as to be large enough to allow a clearing of a flank 191 of at least one pillar 19 of each of the integrated circuits 17 located on either side of the portion of trench 21 located under the opening 25.

For instance, after the formation of the openings 25, at least one flank of at least one pillar of each circuit 17 is exposed.

In order to realize the openings 25, a partial removal of the resin 23 located above the trenches 21 is carried out. The partial removal of the resin 23 may be accompanied by a removal of a part of the pillars 19 located, when viewed from above, on either side of the trenches 21. In the illustrated example, a part of the pillars 19 located on either side of the trenches 21 is removed, which leads to the formation of gradations of width L3 on the pillars 19. The width L3 is, for example, in the order of a few micrometers, for example less than 5 µm.

In the example shown in FIG. 6, each opening 25 is a trench parallel to the underlying trench 21, extending, for example, over the entire length of the underlying trench 21.

Referring again to the view (B) shown in FIG. 3, when viewed from above, the trenches 21 extend according to two orthogonal axes x and y. In the alternative shown in view (B1) of FIG. 6, the trenches 25 are all oriented according to the x axis. More specifically, in this example, each trench 21 oriented according to the x axis has a trench 25 mounted above it.

The alternative shown in the view (B2) of FIG. 6 differs from the alternative shown in the view (B1) in that the trenches 25 are all oriented according to the y axis. More specifically, in this example, each trench 21 oriented according to the y axis has a trench 25 mounted above it.

The alternative shown in the view (B3) of FIG. 6 differs from the alternatives shown in the views (B1) and (B2) in that the trenches 25 comprise trenches 25 oriented according to the x axis and trenches 25 oriented according to the y axis. More specifically, in this example, each trench 21 oriented according to the x axis has a trench 25 oriented according to the x axis mounted above it, and each trench 21 oriented according to the y axis has a trench 25 oriented according to the y axis mounted above it.

The trenches 25 can, for example, be realized by sawing, by using a cutting blade with a width greater than the one used for the realization of the trenches 21. The trenches 21 can, in alternative, be realized by laser etching.

Figure 7:
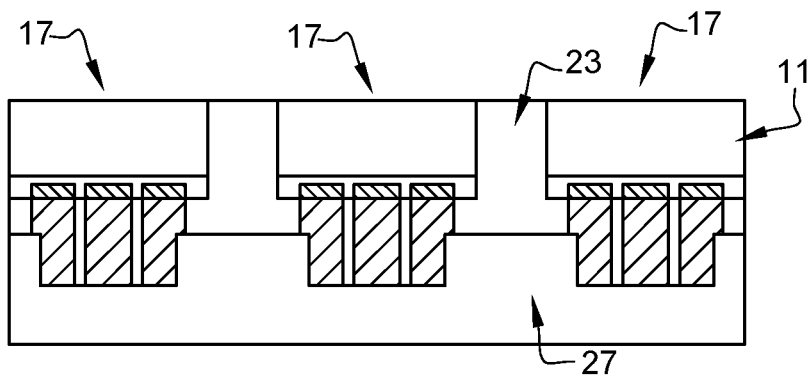
FIG. 7 depicts a further step of a method for manufacturing electronic chips according to the first embodiment.

FIG. 7 depicts a step of thinning, via its rear face, i.e., its lower face in the orientation shown in the view (A) of FIG. 6, the structure obtained at the end of the steps shown in FIGS. 1 to 6.

Before thinning, the structure is fixed, by its front face, i.e., its upper face in the orientation shown in the view (A) of FIG. 6, onto a support film 27.

It should be noted that, in the example shown in FIG. 7, the orientation of the structure is reversed with respect to the sectional views shown in the preceding figures.

Once the structure is mounted on the support film 27, the substrate 11 is thinned via its rear face, for example by CMP. In this example, the substrate 11 is thinned via its rear face until the bottom of the trenches 21 is reached, so that, after thinning, the resin 23 present in the trenches 21 is flush with the rear face of the substrate 11. At the end of this step, the integrated circuits 17 are only coupled to one another by the resin 23 and by the support film 27.

Figure 8:
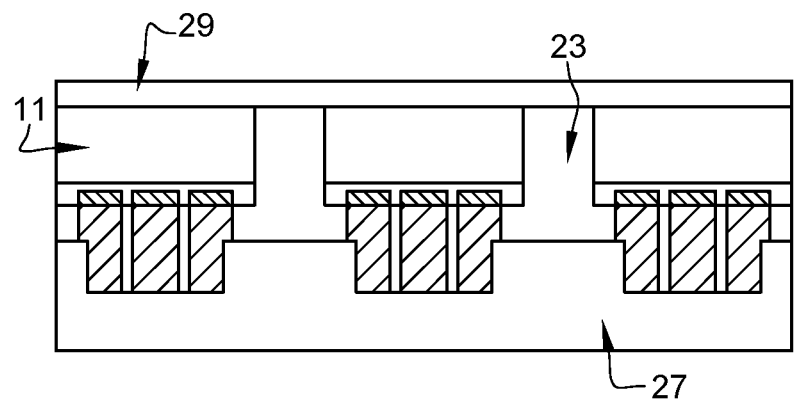
FIG. 8 depicts a further step of a method for manufacturing electronic chips according to the first embodiment.

FIG. 8 is a sectional view, in the same orientation as FIG. 7, depicting a step of depositing a protective resin layer 23 on the rear face of the structure obtained at the end of the steps shown in FIGS. 1 to 7.

The resin layer 29 extends, for example, in a continuous manner and with a substantially constant thickness over the entire surface area of the rear face of the structure. The resin layer 29 has, for example, a thickness in the order of 25 μm. The resin 29 can be an epoxy resin. The resins 29 and 21 can be of the same composition or different compositions.

The step depicted in FIG. 8 can be followed by a step of marking the chips by etching, on each chip, with a marking pattern, for example an identification code or a logo, on the rear face of the layer of resin 29. The marking is, for example, realized by laser etching.

Figure 9:
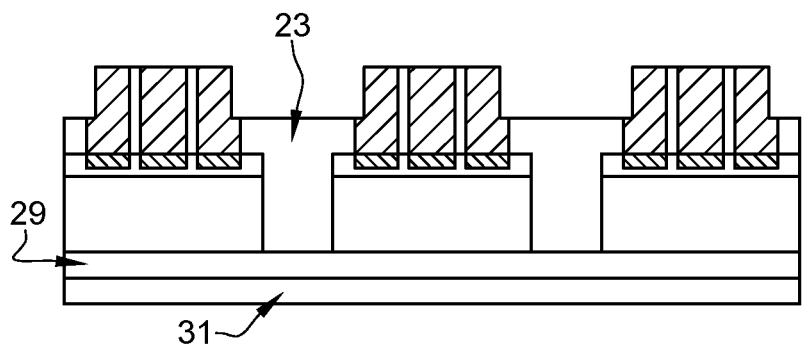
FIG. 9 depicts a further step of a method for manufacturing electronic chips according to the first embodiment.

FIG. 9 depicts a step of removing the support film 27 and of fixing a support film 31 on the side of the rear face of the structure. It should be noted that the orientation shown in FIG. 9 is reversed with respect to the orientation shown in FIGS. 7 and 8.

Figure 10:
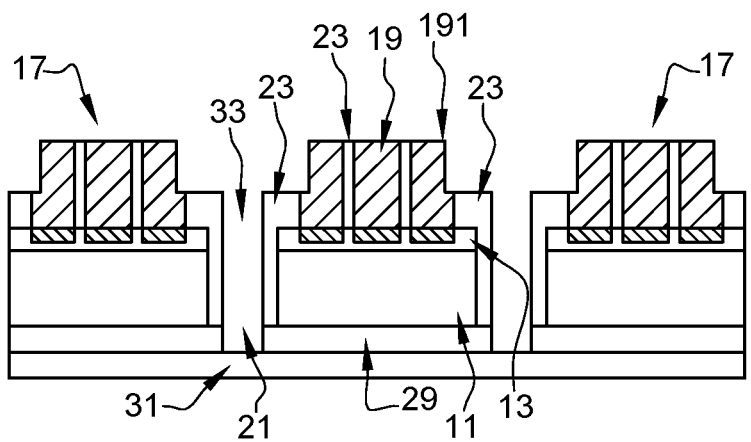
FIG. 10 depicts a further step of a method for manufacturing electronic chips according to the first embodiment.

FIG. 10 is a sectional view in the same orientation as FIG. 9, depicting a step of cutting the structure into individual chips each comprising a single integrated circuit 17. For this purpose, trenches 33 are realized in the resin 23, across from the trenches 21. More specifically, in this example, across from each trench 21, a trench 33 parallel to the trench 21 extending over the entire length of the trench 21 is formed. The trenches 33 extend, vertically, from the upper face to the lower face of the resin 23, and exit on the upper face of the film 31. The width of the trenches 33 is less than that of the trenches 21 so that, after the formation of the trenches 33, each integrated circuit 17 remains covered by resin 23 on its four flanks, and by the resin 29 on its lower face.

At the end of this step, the obtained structure corresponds to a plurality of electronic chips joined solely by the support film 31. The portions of the flanks of the metal pillars exposed in the step shown in FIG. 6 (formation of the openings 25) correspond to portions of wettable flanks of the chips.

The chips can then be removed from the support film 31 with a view to their mounting in an external device.

Figure 11:
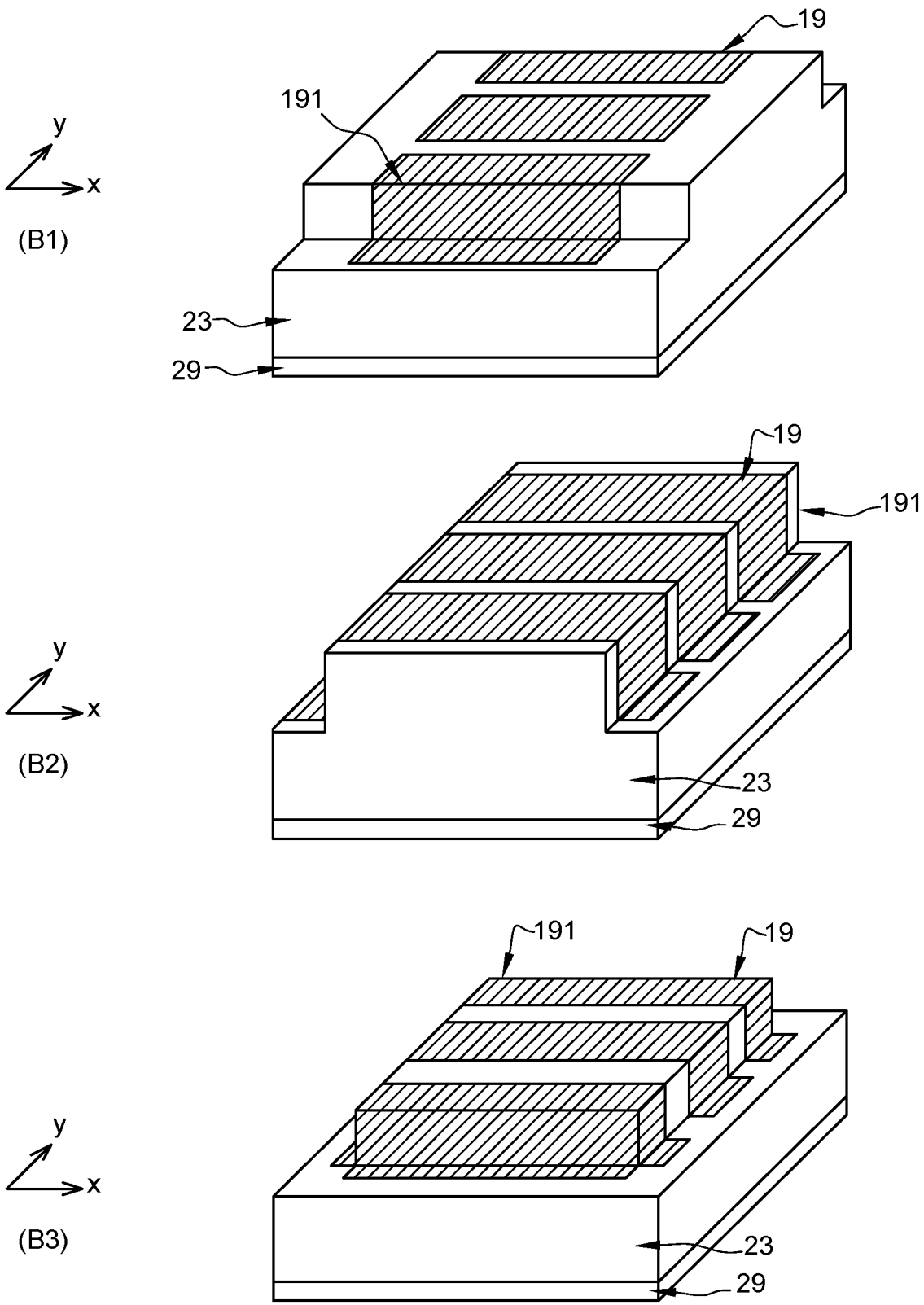
FIG. 11 depicts examples of chips obtained by the method shown in FIGS. 1 to 10.

FIG. 11 depicts examples of chips obtained by the manufacturing method depicted in FIGS. 1 to 10. FIG. 11 comprises more specifically three perspective views (B1), (B2) and (B3) respectively corresponding to the alternatives shown in the views (B1), (B2) and (B3) of FIG. 6.

In the alternative shown in the view (B1), the electronic chip has wettable flank portions parallel to the x axis.

In the alternative shown in the view (B2), the electronic chip has wettable flank portions parallel to the y axis.

In the alternative shown in the view (B3), the electronic chip has wettable flank portions parallel to the x axis and wettable flank portions parallel to the y axis.

Figure 12:
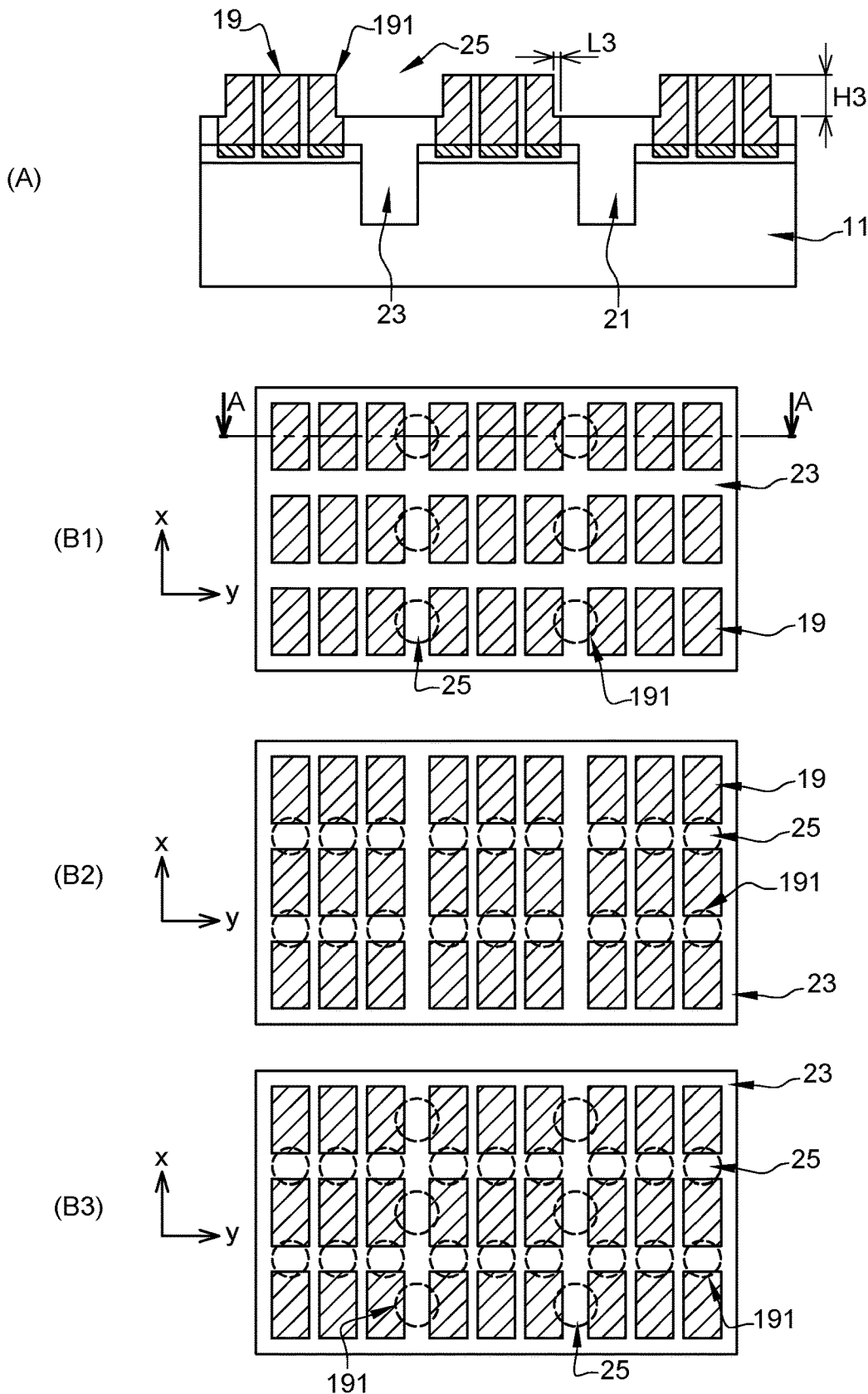
FIG. 12 depicts a step of a method for manufacturing electronic chips according to a second embodiment.
Figure 13:
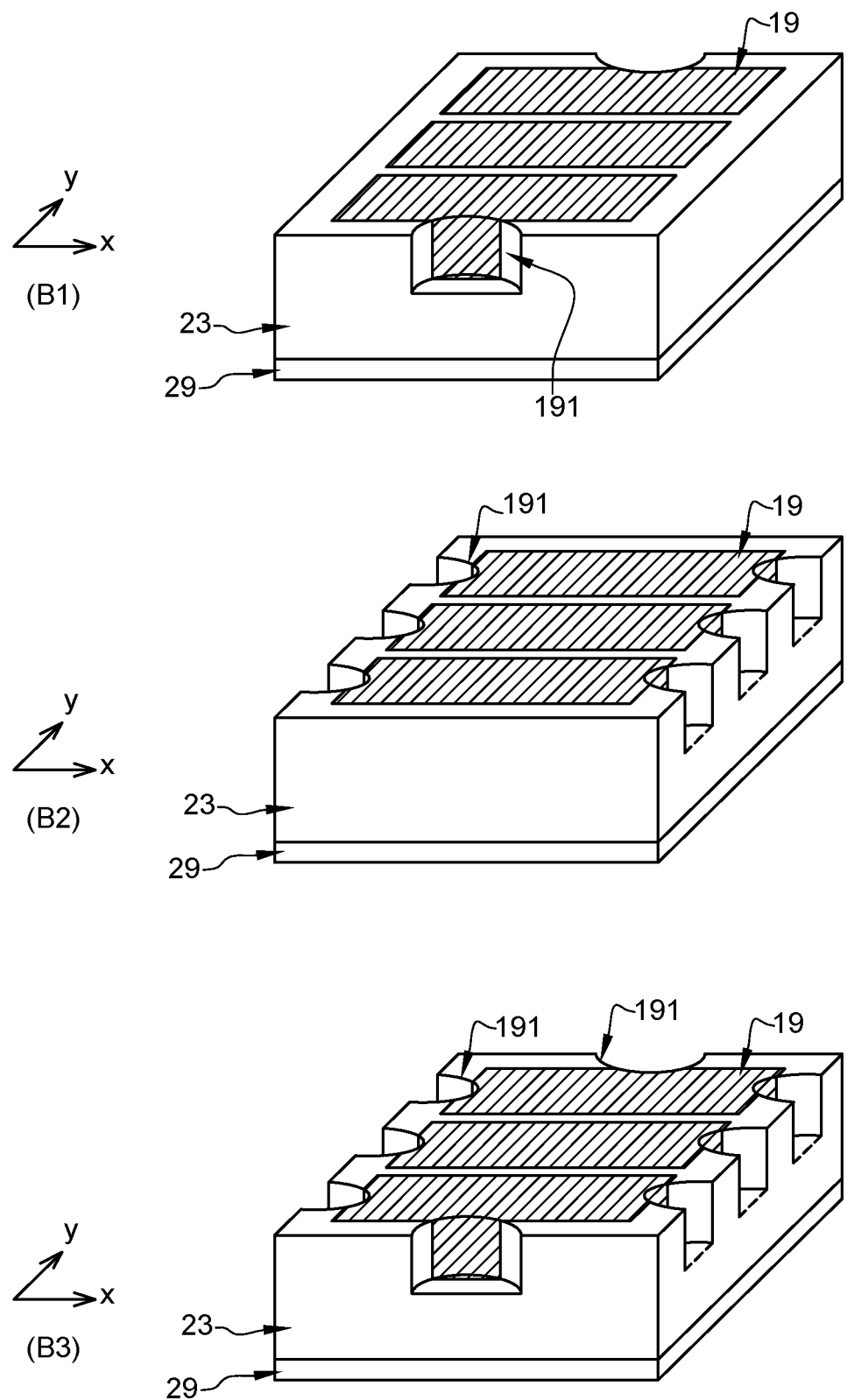
FIG. 13 depicts examples of chips obtained by the method shown in FIG. 12.

FIGS. 12 and 13 depict, in a schematic and partial fashion, steps of an example of a method for manufacturing electronic chips according to a second embodiment. The second embodiment differs from the first embodiment essentially by the method used for realizing the openings 25. The method according to the second embodiment can comprise steps identical or similar to the steps described above in relation to FIGS. 1 to 5. These steps will not be described again in the following.

FIG. 12 depicts a step of forming, on the side of the upper face of the structure obtained at the end of the steps shown in FIGS. 1 to 5, localized openings 25 extending vertically, from the upper face of the structure.

FIG. 12 comprises a sectional view (A) and three top views (B1), (B2), and (B3) of the structure after the formation of the openings 25. The view (A) corresponds to a sectional view, according to the sectional plane A-A indicated in the view (B1). The views (B2) and (B3) illustrate two alternative implementations of the step shown in FIG. 6.

The example shown in FIG. 12 differs from the example shown in FIG. 6 mainly in that, in the example shown in FIG. 12, the openings 25 are not trenches extending over the entire length of the trenches 21, but are localized across from only a part of the length of the trenches 21.

In the alternative shown in the view (B1) of FIG. 12, the openings 25 are disposed across from the trenches 21 oriented according to the x axis. More specifically, a plurality of disjunct openings 25 are formed across from each trench 21 parallel to the x axis, for example distributed regularly along the trench 21.

In the alternative shown in the view (B2) of FIG. 12, the openings 25 are disposed across from the trenches 21 oriented according to the y axis. More specifically, a plurality of disjunct openings 25 are formed across from each trench 21 parallel to the y axis, for example distributed regularly along the trench 21.

In the alternative shown in the view (B3) of FIG. 12, the openings 25 are disposed across from the trenches 21 oriented according to the x axis and across from the trenches 21 oriented according to the y axis. More specifically, a plurality of disjunct openings 25 are formed across from each trench 21 parallel to the x axis, for example distributed regularly along the trench 21, and a plurality of disjunct openings 25 are formed across from each trench 21 parallel to the y axis, for example distributed regularly along the trench 21.

The openings 25 can, for example, be realized by laser ablation. For instance, the openings 25 have a general cylindrical shape. More generally, the openings 25 can have, another shape, for example an oblong shape, in plan view.

The following steps of the method are, for example, identical or similar to the steps described above in relation to FIGS. 7 to 10.

FIG. 13 depicts examples of chips, obtained by a manufacturing method according to the second embodiment.

FIG. 13 comprises more specifically three perspective views (B1), (B2) and (B3) respectively corresponding to the alternatives shown in the views (B1), (B2) and (B3) of FIG. 12.

In the example shown in the view (B1) of FIG. 13, the electronic chip has wettable flank portions respectively located on its edges parallel to the x axis.

In the example shown in the view (B2) of FIG. 13, the electronic chip has wettable flank portions located on its edges parallel to the y axis and wettable flank portions located on its edges parallel to the y axis.

In the example shown in the view (B2) of FIG. 13, the electronic ship has three wettable flank parts located on an edge of the chip parallel to the y axis, three further wettable flank parts located on an edge of the chip parallel to the y axis and two wettable flank parts respectively located on two edges of the chip parallel to the x axis.

FIGS. 14 to 23 depict, in a very schematic and partial fashion, steps of an example of a method for manufacturing electronic chips according to a third embodiment. The third embodiment differs from the first and second embodiments essentially by the method used for realizing the metal connection pillars 19 of the chips.

Figure 14:
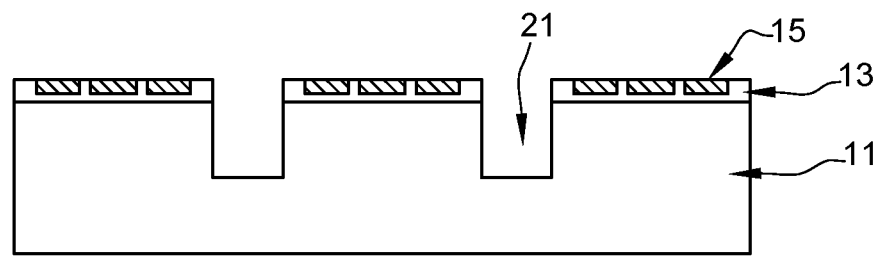
FIG. 14 depicts a step of a method for manufacturing electronic chips according to a third embodiment.

FIG. 14 depicts a step of forming trenches 21 in the upper face of a structure identical or similar to the structure shown in FIG. 1. The realization of the trenches 21 is, for example, identical or similar to what was described in the foregoing in relation to FIG. 3, with the difference that, in the example shown in FIG. 14, the trenches are formed before the realization of the metal connection pillars 19 of the chips.

Figure 15:
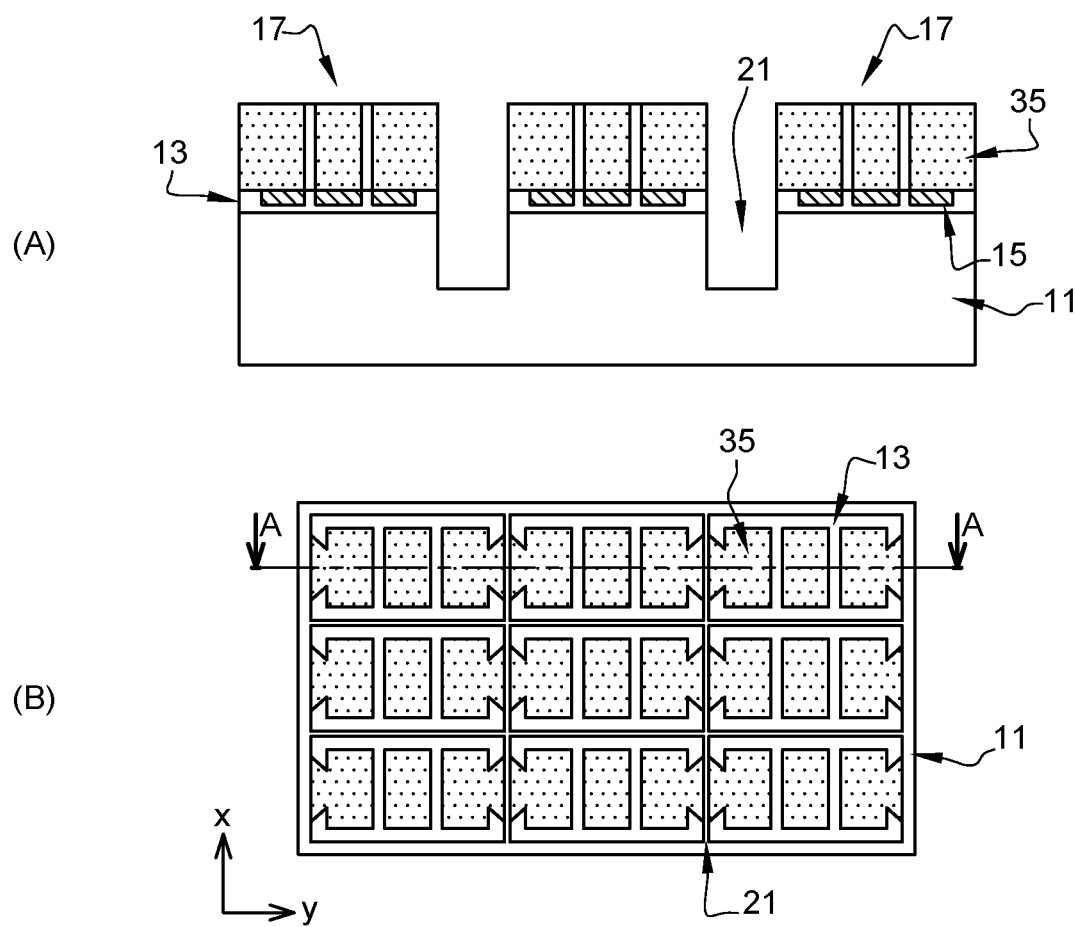
FIG. 15 depicts a further step of a method for manufacturing electronic chips according to a third embodiment.
Figure 16:
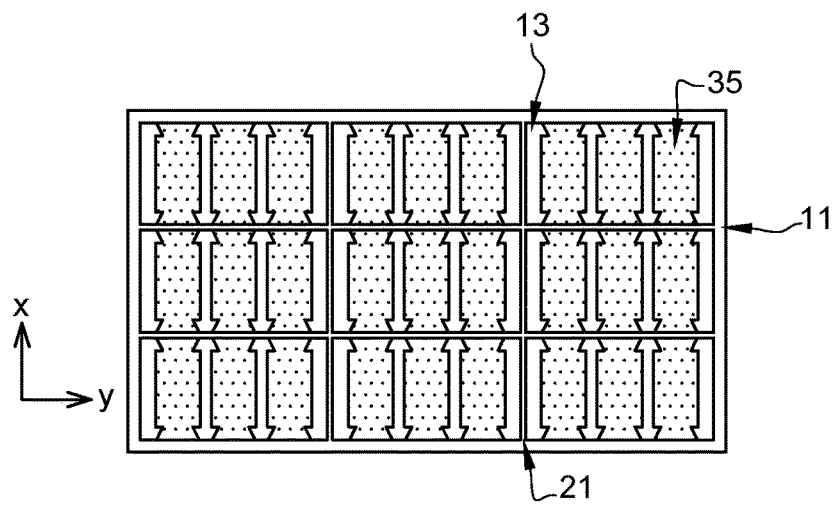
FIG. 16 depicts a further step of a method for manufacturing electronic chips according to a third embodiment.
Figure 17:
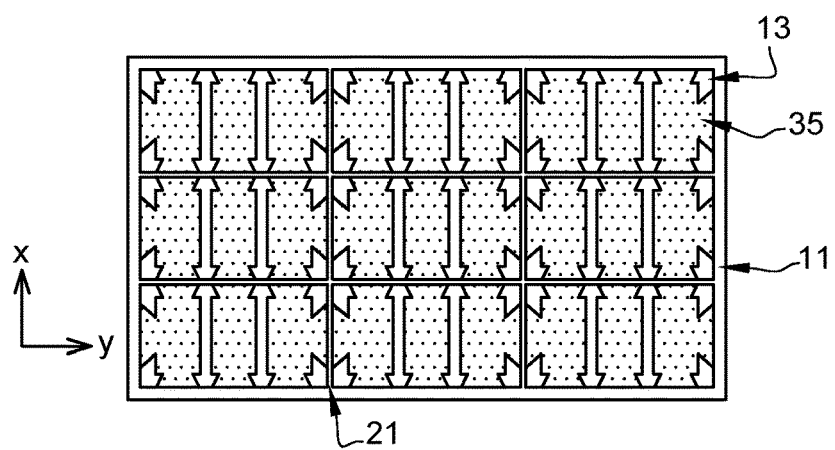
FIG. 17 depicts a further step of a method for manufacturing electronic chips according to a third embodiment.

FIG. 15 depicts a step of forming, in the upper face of the structure obtained at the end of the step shown in FIG. 14, patterns 35 in a sacrificial resin. FIG. 15 comprises a sectional view (A) and a top view (B) of the structure after the formation of the resin patterns 35. The view (A) corresponds to a sectional view, according to the sectional plane A-A indicated in the view (B). FIGS. 16 and 17 are top views respectively depicting two alternative implementations of the step shown in FIG. 15.

The patterns 35 realized during this step have substantially the same shape and the same arrangement as the metal connection pillars 19 to be realized on each integrated circuit.

The realization of the resin pillars 35 comprises, for example, the deposition of a film of photosensitive resin extending in a continuous manner over the entirety of the front face of the structure. For instance, the resin film is deposited on and in contact with the upper face of the interconnection stack 13 and extends above the trenches 21. The pillars 35 can then be formed by photolithography in the film of photosensitive resin. During this step, the photosensitive resin film is removed everywhere except at the location of the pillars 35.

For instance, the resin pillars 35 are arranged so that each metal contact pad 15 has a sole resin pillar 35 mounted above it and so that each resin pillar 35 covers a single pad 15.

For instance, each pad 15 is completely covered by a resin pillar 35. A resin pillar 35 can, for example, extend, when viewed from above, beyond an edge of the underlying pad 15. In the following, the part of a resin pillar 35 extending, when viewed from above, beyond an edge of the underlying pad 15 will be called a protrusion.

For instance, at least one pillar 35 having a protrusion extending, when viewed from above, up to a lateral edge of the integrated circuit 17, i.e., up to the edge of a trench 21, is realized above each integrated circuit 17.

In the example shown in the view (B) of FIG. 15, at least one pillar 35 is flush with each lateral flank oriented according to the x axis of each integrated circuit 17.

In the example shown in FIG. 16, at least one pillar 35 is flush with each lateral flank oriented according to the y axis of each integrated circuit 17.

In the example shown in FIG. 17, at least one pillar 35 is flush with each lateral flank oriented according to the x axis and with each lateral flank oriented according to the y axis of each integrated circuit 17.

Figure 18:
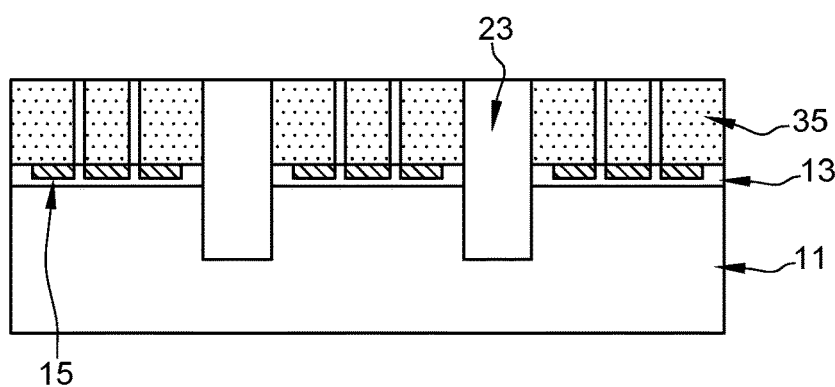
FIG. 18 depicts a further step of a method for manufacturing electronic chips according to a third embodiment.

FIG. 18 is a sectional view depicting a step of depositing a protective resin layer 23 on the upper face of the structure obtained at the end of the step shown in FIG. 15, followed by a step of planarization of the upper face of the structure.

These steps are, for example, identical or similar to the steps described in the foregoing in relation to FIGS. 4 and 5, with the difference that, in the example shown in FIG. 18, the metal pillars 19 are replaced by resin pillars 35. The protective resin layer 23 deposited during this step is, for example, identical or similar to the protective resin 23 described in the foregoing in relation to FIG. 4.

Figure 19:
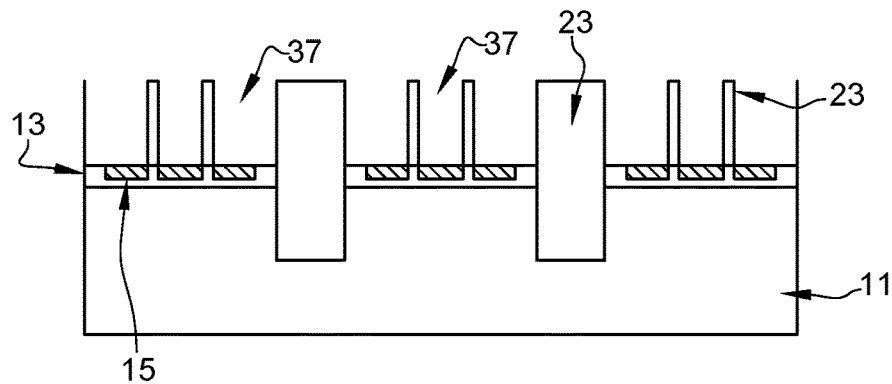
FIG. 19 depicts a further step of a method for manufacturing electronic chips according to a third embodiment.

FIG. 19 is a sectional view depicting a step of removing the sacrificial resin pillars 35. During this step, the resin pillars 35 are removed in a selective manner with respect to the protective resin 23. Thus, at the end of the step shown in FIG. 19, the pattern formed in the protective resin layer 23 corresponds to the complement of the pattern formed in the layer of sacrificial resin in the step shown in FIGS. 15 to 17. In other words, at the end of this step, the protective resin layer 23 comprises cavities 37 having substantially the same shape as the pillars 35.

Figure 20:
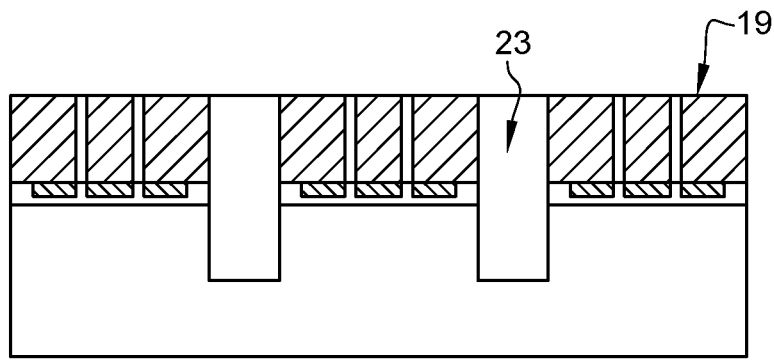
FIG. 20 depicts a further step of a method for manufacturing electronic chips according to a third embodiment.

FIG. 20 is a sectional view depicting a step of forming the metal connection pillars 19 in the cavities 37 formed in the resin 23, i.e., at the locations occupied beforehand by the pillars 35. For instance, the pillars 19 have substantially the same shape, the same dimensions and the same arrangement as the pillars 35.

The formation of the pillars 19 comprises a step of filling the cavities 37 with metal, for example over their entire height. For instance, the thickness of deposited metal is greater than the height of the cavities 37. A step of planarizing the upper face of the structure can then be provided so that the metal pillars 19 are flush with the upper face of protective resin 23. The pillars are, for example, made of a tin-based alloy, preferably an alloy based on tin and silver (SnAg).

The deposition of the metal constituting the pillars 39 can be a non-electrolytic deposition, for example a deposition by printing or screen printing.

Figure 21:
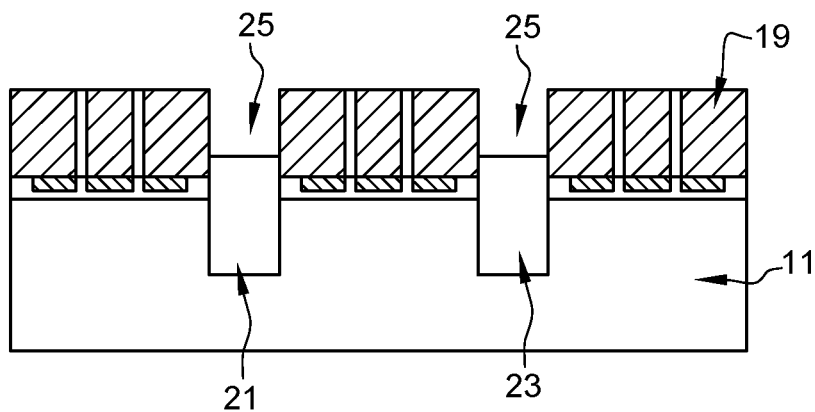
FIG. 21 depicts a further step of a method for manufacturing electronic chips according to a third embodiment.

FIG. 21 depicts a step of forming, on the side of the upper face of the structure obtained at the end of the steps shown in FIGS. 14 to 20, openings 25 extending, from the upper face of the structure across from the trenches 21. This step is, for example, identical or similar to the step described in the foregoing in relation to FIG. 6 (formation of openings 25 having the shape of trenches) or in relation to FIG. 12 (formation of localized openings).

Figure 22:
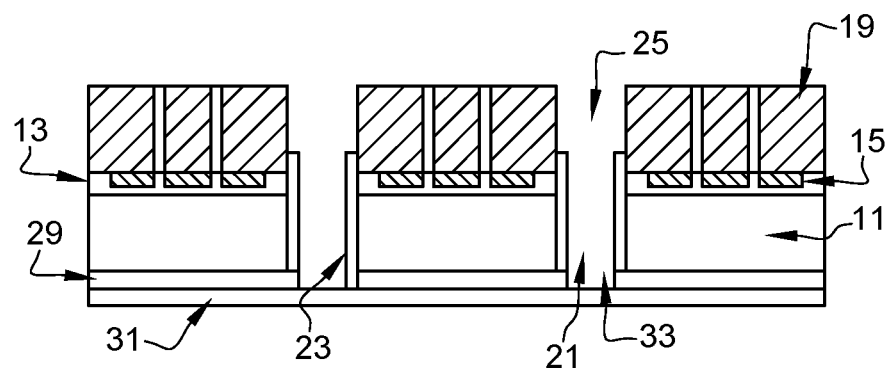
FIG. 22 depicts a further step of a method for manufacturing electronic chips according to a third embodiment.

FIG. 22 depicts the structure obtained at the end of the following successive steps:

thinning the structure shown in FIG. 21, via its rear face (its lower face in the orientation shown in FIG. 21) until the bottom of the trenches 21 is reached;

depositing a protective resin layer 29, on the rear face of the structure;

fixing the structure, by its rear face, onto a support film 31; and cutting the structure into individual chips each comprising a single integrated circuit 17.

These steps are, for example, identical or similar to the steps described in the foregoing in relation to FIGS. 7 to 10.

Figure 23:
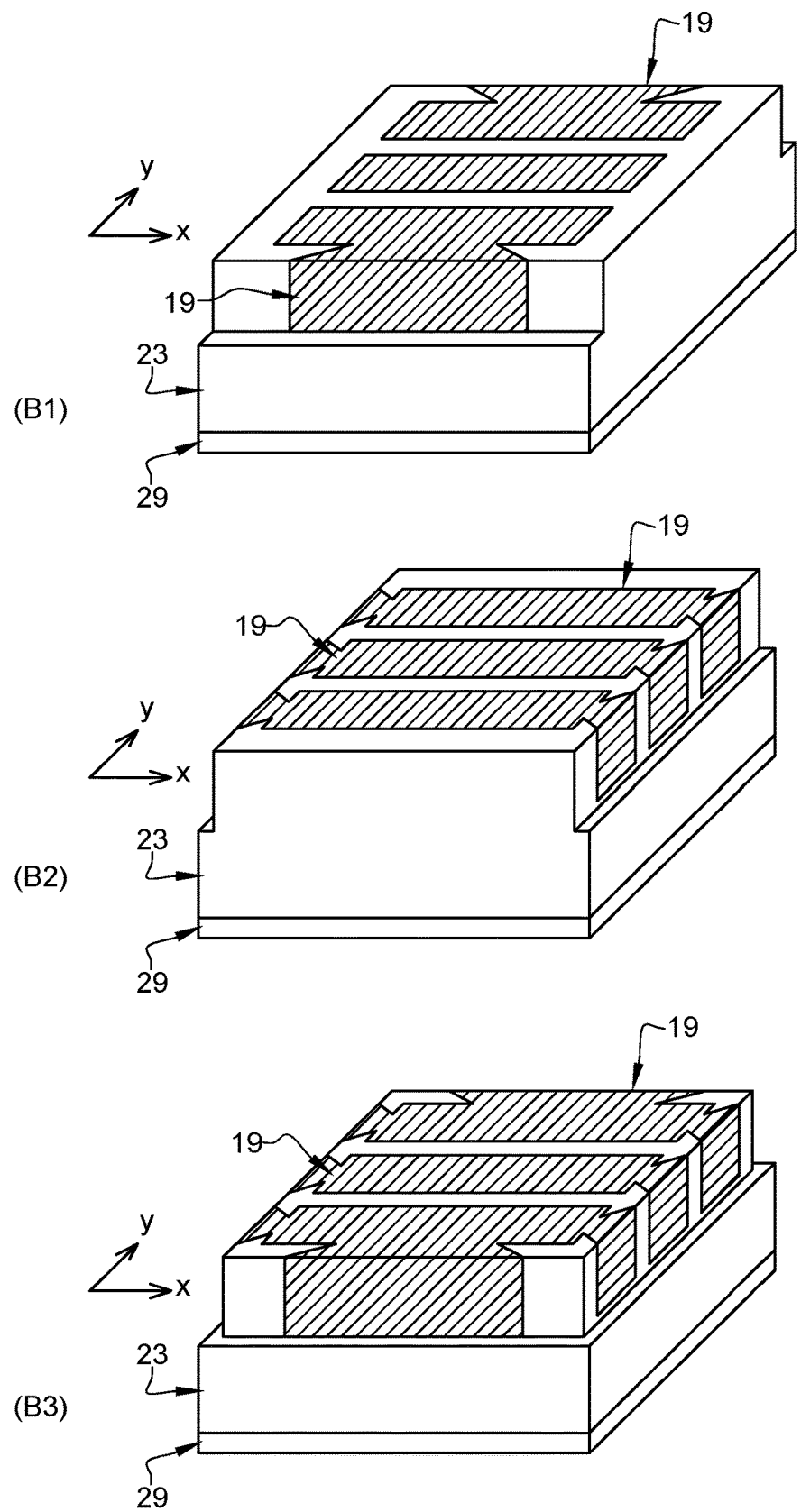
FIG. 23 depicts examples of chips obtained by the method shown in FIGS. 14 to 22.

FIG. 23 depicts examples of chips obtained by the manufacturing method depicted in FIGS. 14 to 22. FIG. 23 comprises more specifically three perspective views (B1), (B2) and (B3) respectively corresponding to the alternatives shown in the FIG. 15 (view B), 16 and 17.

In the alternative shown in the view (B1), the electronic chip has wettable flank portions parallel to the x axis.

In the alternative shown in the view (B2), the electronic chip has wettable flank portions parallel to the y axis.

In the alternative shown in the view (B3), the electronic chip has wettable flank portions parallel to the x axis and wettable flank portions parallel to the y axis.

An advantage of the third embodiment is that it allows the formation of metal pillars 19 of any shape, and in particular of pillars 19 not having the same shape as the underlying metal pads 15. By this means, it is in particular possible to obtain metal pillars 19 that are closer, when viewed from above, to the edges of the trenches 21, and thus to the edges of the chip, than the underlying metal connection pads 15.

It should be noted that the method for forming metal pillars 19 described in relation to FIGS. 15 to 20, comprising a step of forming pillars of sacrificial resin 35, followed by a step of molding, in a layer of protective resin 23, cavities 37 with shapes identical or substantially similar to those of the pillars 35, followed by a step of filling the cavities 37 with metal, can also be used for the realization of electronic chips that do not have wettable flanks.

For instance, a method similar to the one described in relation to FIGS. 14 to 22 can be implemented, by omitting the step shown in FIG. 21, i.e., the step of forming the openings 25 leading to the exposure of portions of the flanks of the metal connection pillars 19 of the chips.

In this case, after cutting the structure into individual chips (FIG. 22), the flanks of the chips are entirely covered by the protective resin 23 and thus do not have any wettable flanks.

This method is in particular advantageous in that it allows the formation of metal connection pillars 19 of any shape, independently of the shape of the metal contact pads 15 of the chips. In addition, it allows use methods of the screen printing or printing type for forming the metal connection pillars 19. These methods have the advantage of being less expensive than electrolytic metal deposition methods.

Figure 24:
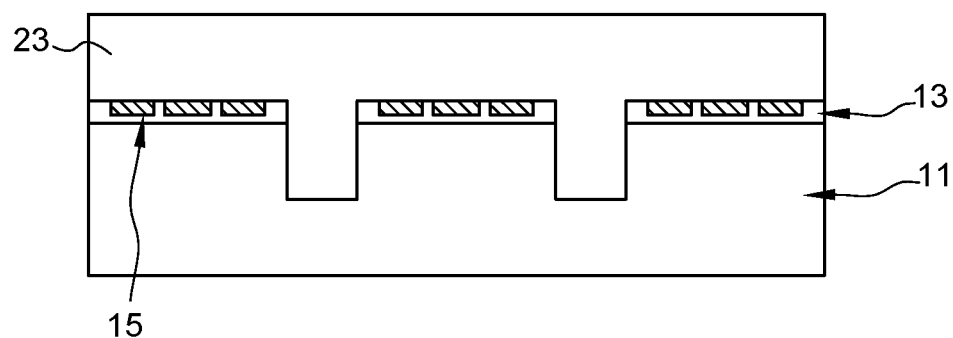
FIG. 24 depicts a step of a method for manufacturing electronic chips according to a fourth embodiment.
Figure 25:
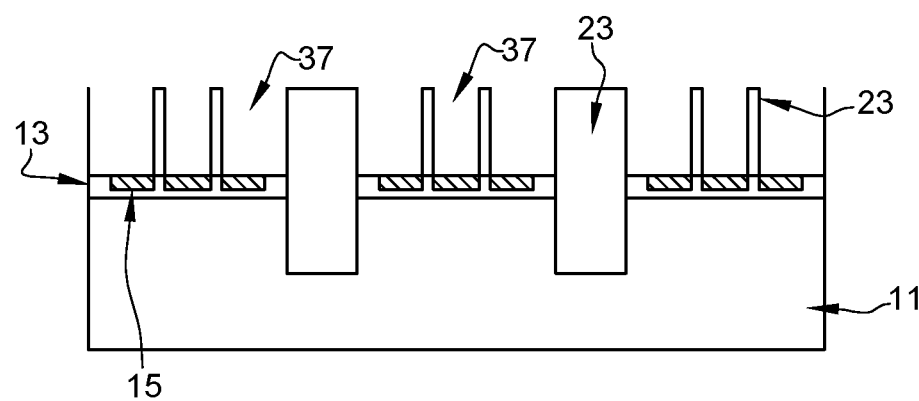
FIG. 25 depicts a further step of a method for manufacturing electronic chips according to the fourth embodiment.

FIGS. 24 and 25 depict, in a schematic and partial fashion, steps of an example of a method for manufacturing electronic chips according to a fourth embodiment. The fourth embodiment differs from the first, second and third embodiments essentially by the method used for realizing the metal connection pillars 19 of the chips.

In this example, the method comprises an initial step identical or similar to the step described in relation with FIG. 14.

FIG. 24 depicts a step of depositing a protective resin layer 23 on the upper face of the structure obtained at the end of the step of FIG. 14. More specifically, in this example, the upper face of the structure is completely covered. In particular the stack 13 is covered and the trenches 21 are filled by the protective resin 23. The resin 23 is, for example, an epoxy resin.

FIG. 25 depicts a step of forming localized cavities 37 in the resin layer 23. The cavities 37 realized during this step have substantially the same shape and the same arrangement as the metal connection pillars 19 to be realized on each integrated circuit.

The cavities 37 can be formed by laser ablation or laser drilling.

For instance, the cavities 37 may have substantially the same shape as the cavities 37 obtained at the end of the steps of FIGS. 14 to 19.

The following steps (not shown) can be identical or similar to those described in relation with FIGS. 20 to 23.

An advantage of the fourth embodiment is that it allows the formation of metal pillars 19 of any shape, and in particular of pillars 19 not having the same shape as the underlying metal pads 15.

It should be noted that this method for forming metal pillars can also be used for the realization of electronic chips that do not have wettable flanks.

Various embodiments and alternatives have been described. Those skilled in the art will understand that certain features of these embodiments can be combined and other alternatives will readily occur to those skilled in the art. In particular, the described embodiments are not limited to the example dimensions and materials mentioned above.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate including a first surface, a second surface opposite to the first surface, a first edge, and a second edge opposite to the first edge, and the first and second edges are transverse;
a plurality of contact pads on the first surface of the substrate;
a plurality of connection pillars in contact with the plurality of contact pads and extending away from the substrate, and each pillar of the plurality of pillars has a longer dimension that extends from between the first edge and the second edge;
a first resin on the second surface of the substrate;
a second resin on the first resin and around the plurality of connection pillars, a first one of the plurality of connection pillars including a third surface that is opposite to the first surface of the substrate, and a fourth surface that is between the third surface and the first surface of the substrate; and
a first step that extends from the first edge to the second edge and the first one of the first one of the plurality of connection pillars is aligned with the first step.

2. The device of claim 1 wherein a second one of the plurality of connection pillars includes a fifth surface that is opposite to the first surface of the substrate, and a sixth surface that is between the fifth surface and the first surface of the substrate.

3. The device of claim 2 wherein a third one of the plurality of connection pillars includes a seventh surface that is opposite to the first surface of the substrate, and an eighth surface that is between the seventh surface and the first surface of the substrate.

4. The device of claim 1 further comprising a second step that extends from the first edge to the second edge.

5. The device of claim 4 further comprising a second one of the plurality of connection pillars includes a fifth surface that is opposite to the first surface of the substrate, and a sixth surface that is between the fifth surface and the first surface of the substrate, the second one of the plurality of connection pillars is aligned with the second step.

6. A device, comprising:
  a substrate;
  a first connection pillar on the substrate;
  a first resin adjacent to the first pillar and on the substrate;
  a first step that is in and on the first pillar and in and on the first resin, the first step that is partially cylindrical in shape, and the first step includes:
    a first curved sidewall of the first connection pillar;
    one or more second curved sidewalls of the first resin that are directly adjacent to and abuts the first curved sidewall, the one or more second curved sidewalls are flush at respective locations at which the one or more second curved sidewalls abut the first curved sidewall;
    a first surface of the first resin is transverse to the first curved sidewall and the one or more second curved sidewalls, wherein the first curved sidewall, the one or more second curved sidewalls, and the first surface delimit and define the first step.

7. The device of claim 6, further comprising a second connection pillar on the substrate and a second step that is on and in the second pillar and in and on the first resin, the second step being partially cylindrical in shape.

8. The device of claim 7, wherein the second step includes:
  a third curved sidewall of the second connection pillar;
  one or more fourth curved sidewalls of the first resin that are directly adjacent to and abuts the third curved sidewall, the one or more third curved sidewalls are flush at respective locations at which the one or more fourth curved sidewalls abut the third curved sidewall; and
  a second surface of the first resin is transverse to the third curved sidewall and one or more fourth curved sidewalls, wherein the third curved sidewall, the one or more fourth curved sidewalls, and the second surface delimit and define the second step.

9. The device of claim 7, further comprising a third pillar that is between the first pillar and the second pillar.

10. A device, comprising:
  a substrate;
  a first contact on the substrate;
  a first resin on the substrate;
  a first connection pillar on the first contact and within the first resin; and
  a first step that is delimited and defined by:
    a first side surface of the first connection pillar;
    a second side surface of the first resin; that is directly adjacent to and abuts the first side surface of the first connection pillar; and
    a first surface of the resin that is transverse to the first side surface and the second side surface, wherein the first side surface is exposed from the first resin and the first side surface is flush with the second side surface at least at a location at which the first side surface abuts the second side surface.

11. The device of claim 10, further comprising a second contact and a second connection pillar on the second contact.

12. The device of claim 11, further comprising a second step that is delimited and defined by:
  a third side surface of the second connection pillar;
  a fourth side surface of the first resin that is directly adjacent to and abuts the third side surface of the connection pillar; and
  a second surface of the first resin that is transverse to the third side surface and the fourth side surface, wherein the third side surface is exposed from the first resin and the third side surface is flush with the fourth side surface at least at a location at which the third side surface abuts the fourth side surface.

13. The device of claim 12, further comprising a third contact and a third connection pillar that is between the first connection pillar and the second connection pillar.

14. The device of claim 10, further comprising a second contact and a second connection pillar on the second contact and a third contact and a third connection pillar that is between the first connection pillar and the second connection pillar, the first step is further delimited and defined by:
  a third side surface of the second connection pillar; and
  a fourth side surface of the third connection pillar, wherein the third side surface of the second connection pillar and the fourth side surface of the third connection pillar are transverse to the first surface of the first resin.

15. The device of claim 14, further comprising a second step that is delimited and defined by:
  a fifth side surface of the first connection pillar, opposite to the first side surface of the first connection pillar;
  a sixth side surface of the second connection pillar, opposite to the third side surface of the second connection pillar; and
  a seventh side surface of the third connection pillar opposite to the fourth side surface of the third connection pillar.

16. The device of claim 12, wherein the third side surface, the fourth side surface, and the second surface of the first resin are transverse to first side surface of the first connection pillar, the second side surface of the first resin, and the first surface of the first resin.

17. The device of claim 12, wherein first step is opposite to the second step.

18. The device of claim 17, further comprising a second connection pillar and a third connection pillar between the first connection pillar and the second connection pillar.

19. The device of claim 6, wherein the surface of the first step includes a second surface of the connection pillar transverse to the first curved sidewall of the first connection pillar and the one or more second curved sidewalls of the first resin.

20. The device of claim 7, further comprising a third connection pillar on the substrate and a third step that is on and in the third pillar and in and on the first resin, the third step being partially cylindrical in shape.

* * * * *